(12) United States Patent
Sasaki et al.

(10) Patent No.: US 6,579,056 B2
(45) Date of Patent: Jun. 17, 2003

(54) CART FOR MOUNTING/DEMOUNTING WAFER TRANSFER ROBOT

(75) Inventors: Yoshiaki Sasaki, Nirasaki (JP); Takaaki Hirooka, Nirasaki (JP); Shuji Hagihara, Okazaki (JP)

(73) Assignees: Tokyo Electron Limited, Tokyo-To (JP); Shinko Electric Company, Ltd., Tokyo-To (JP)

( * ) Notice: Subject to any disclaimer, the term of this patent is extended or adjusted under 35 U.S.C. 154(b) by 0 days.

(21) Appl. No.: 09/870,728

(22) Filed: Jun. 1, 2001

(65) Prior Publication Data

US 2001/0048871 A1 Dec. 6, 2001

(30) Foreign Application Priority Data

Jun. 2, 2000 (JP) ........................................ 2000-165434

(51) Int. Cl.[7] ................................................. B65G 29/00
(52) U.S. Cl. ....................................... 414/539; 414/540
(58) Field of Search ............................... 414/396, 584, 414/459, 540, 539, 750

(56) References Cited

U.S. PATENT DOCUMENTS 3,869,052 A * 3/1975 Leahy ...................... 214/38 B
4,203,697 A * 5/1980 Cayton ........................ 414/345
5,077,513 A * 12/1991 Dea et al. ....................... 320/2
5,096,354 A * 3/1992 Wu .............................. 414/265
5,301,700 A * 4/1994 Kamikawa et al. ........... 134/76
5,967,740 A * 10/1999 Pflueger et al. .............. 414/750
6,318,951 B1 * 11/2001 Schmidt et al. ........... 414/744.5

FOREIGN PATENT DOCUMENTS

| JP | 2001-35899 | 2/2001 |
| WO | WO 01/08211 | 2/2001 |

* cited by examiner

*Primary Examiner*—Eileen D. Lillis
*Assistant Examiner*—Charles A. Fox
(74) *Attorney, Agent, or Firm*—Smith, Gambrell & Russell, LLP (57) ABSTRACT

An object of the present invention is to provide a wafer transfer robot mount/demount cart for simply mounting and demounting a wafer transfer robot which is linearly, substantially horizontally reciprocated in a wafer transfer apparatus to transfer wafers. A pair of mount/demount cart-side rails 9 which can be connected to a pair of wafer transfer apparatus-side guide rails mounted inside a wafer transfer apparatus D is mounted on a raised portion 5 of the mount/demount cart A. A joint rail S is mounted in a gap between the pair of wafer transfer apparatus-side rails and the pair of mount/demount cart-side rails 9 so as to slide a wafer transfer robot R onto the pair of mount/demount cart-side rails 9 via the joint rail S.

12 Claims, 12 Drawing Sheets

CART FOR MOUNTING/DEMOUNTING WAFER TRANSFER ROBOT

CROSS REFERENCE TO RELATED APPLICATIONS

The subject application is related to subject matter disclosed in Japanese Patent Application No. 2000-165434 filed on Jun. 2, 2000 in Japan to which the subject application claims priority under Paris Convention and which is incorporated herein by reference.

BACKGROUND OF THE INVENTION

1. Field of the Invention

The present invention relates to a cart for mounting and demounting a wafer transfer robot which is engaged in guide rails mounted substantially horizontally on the inside wall surface of a wafer transfer apparatus and is linearly reciprocated substantially horizontally.

2. Related Background Art

Figure 11:
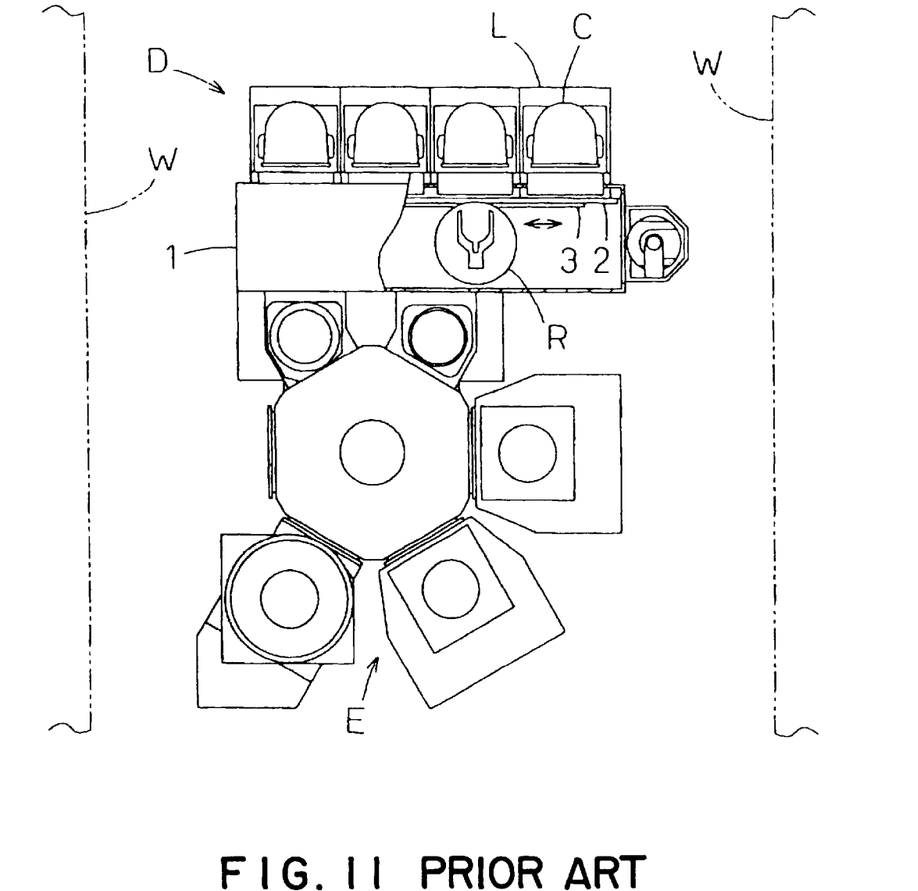
FIG. 11 is a view of one example of layouts of the wafer transfer apparatus and the wafer processing unit.
Figure 12:
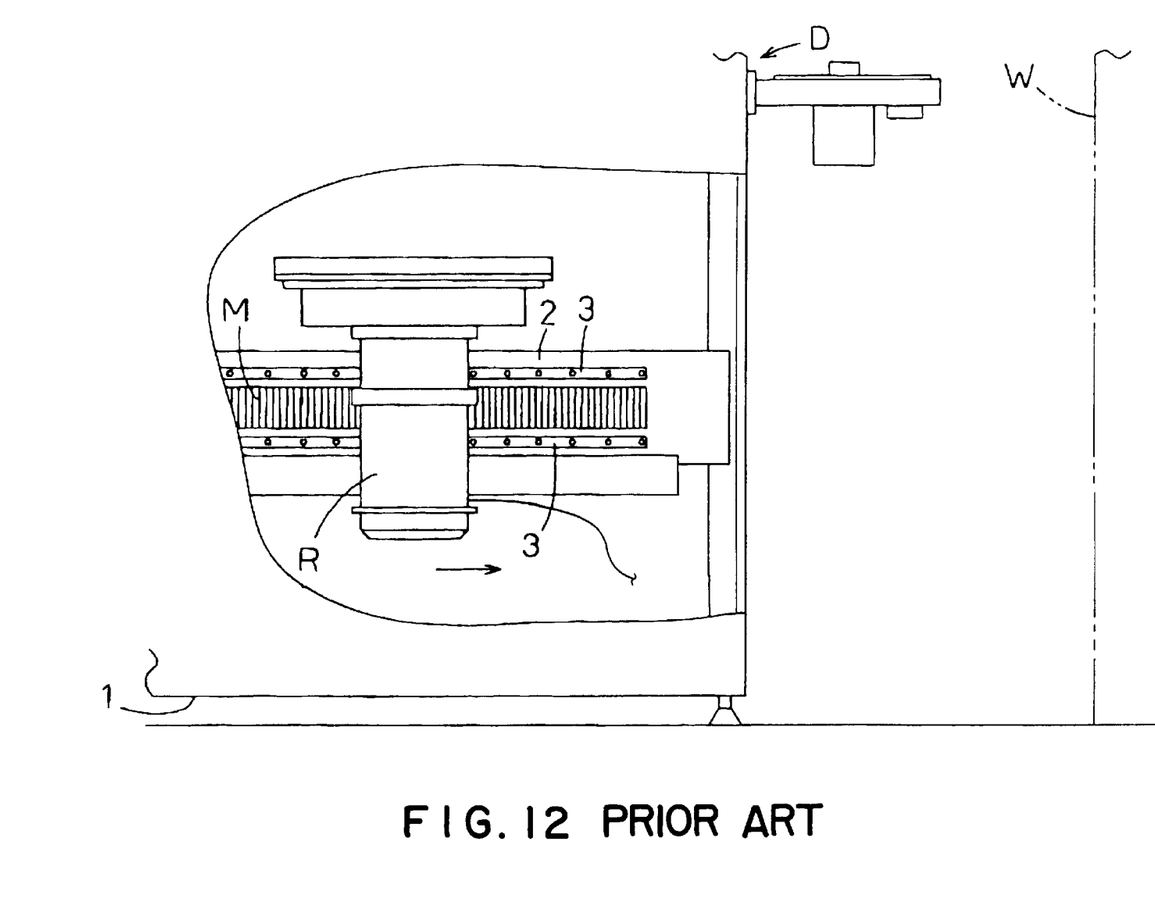
FIG. 12 is a partially broken front view of the wafer transfer apparatus.

A wafer transfer apparatus D described in, e.g., Japanese Patent Application No. H11-21017 is, as shown in FIGS. 11 and 12, an apparatus for taking out one by one wafers (not shown) in wafer carriers mounted on a load port apparatus L to transfer the wafers onto a wafer processing unit E. Each wafer is transferred by a wafer transfer robot R disposed inside a chamber 1. A pair of wafer transfer apparatus-side guide rails 3 are mounted substantially horizontally one above the other on a wafer transfer apparatus-side base plate 2 disposed inside the chamber 1 nearer the load port apparatus L of the wafer transfer apparatus D. The wafer transfer robot R is engaged with the pair of wafer transfer apparatus-side guide rails 3 and is linearly reciprocated by a linear motor M.

When a malfunction takes place in the wafer transfer robot R included in the wafer transfer apparatus D, in a periodic maintenance or in other occasions, the wafer transfer robot R must be demounted from the wafer transfer apparatus D. The wafer transfer robot R is so heavy that it is difficult to properly demount the wafer transfer robot R only manually by operators.

As shown in FIG. 11, in some cases, walls W are present adjacent both sides of the wafer transfer apparatus D, and in other cases, other apparatuses are positioned adjacent both sides of the wafer transfer apparatus D. In such cases, a gap between the wafer transfer apparatus D and the walls W is small (about 60 cm), which makes it further difficult for operators to properly demount the wafer transfer robot R only manually.

SUMMARY OF THE INVENTION

An object of the present invention is to provide a mount/demount cart which can mount and demount a wafer transfer robot on and from a wafer transfer apparatus.

In order to achieve the above-described object, the wafer transfer robot mount/demount cart according to the present invention for mounting and demounting a wafer transfer robot which can be linearly reciprocated along a guide rail mounted horizontally on a wafer transfer apparatus comprises a carrier base and a raised portion raised on the carrier base, the raised portion including a rail provided capable of being connected to the guide rail to slide the wafer transfer robot along the guide rail of the wafer transfer apparatus onto the mount/demount cart.

The mount/demount cart according to the present invention is positioned near the side surface of one side of a wafer transfer apparatus. The guide rail of the wafer transfer apparatus and the rail of the mount/demount cart are connected to each other. A wafer transfer robot disposed in the wafer transfer apparatus slides as it is from the guide rail of the wafer transfer apparatus onto the rail mounted on the mount/demount cart. The wafer transfer robot R is demounted from the wafer transfer apparatus to be supported by the rail of the mount/demount cart. Operators may only slide the wafer transfer robot, which is heavy, along the guide rail, and the operation is simple. Furthermore, the wafer transfer robot is retained upright and retained accordingly stable.

BRIEF DESCRIPTION OF THE DRAWINGS

FIG. 10 is an explanatory view of the operation of retreating the mount/demount cart with the wafer transfer robot mounted on.

DESCRIPTION OF THE PREFERRED EMBODIMENTS

Figure 1:
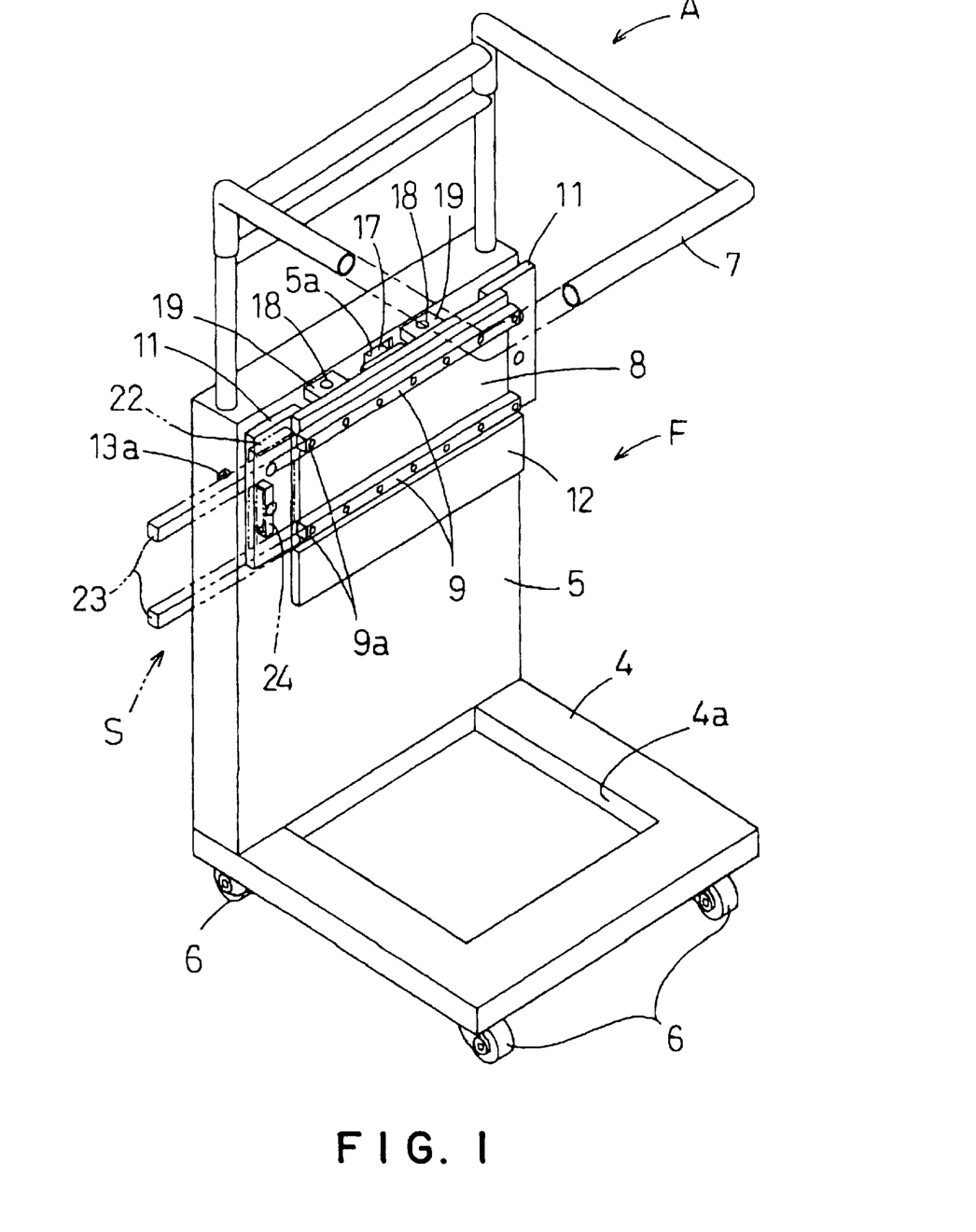
FIG. 1 is a perspective view of the mount/demount cart according to one embodiment of the present invention.
Figure 2:
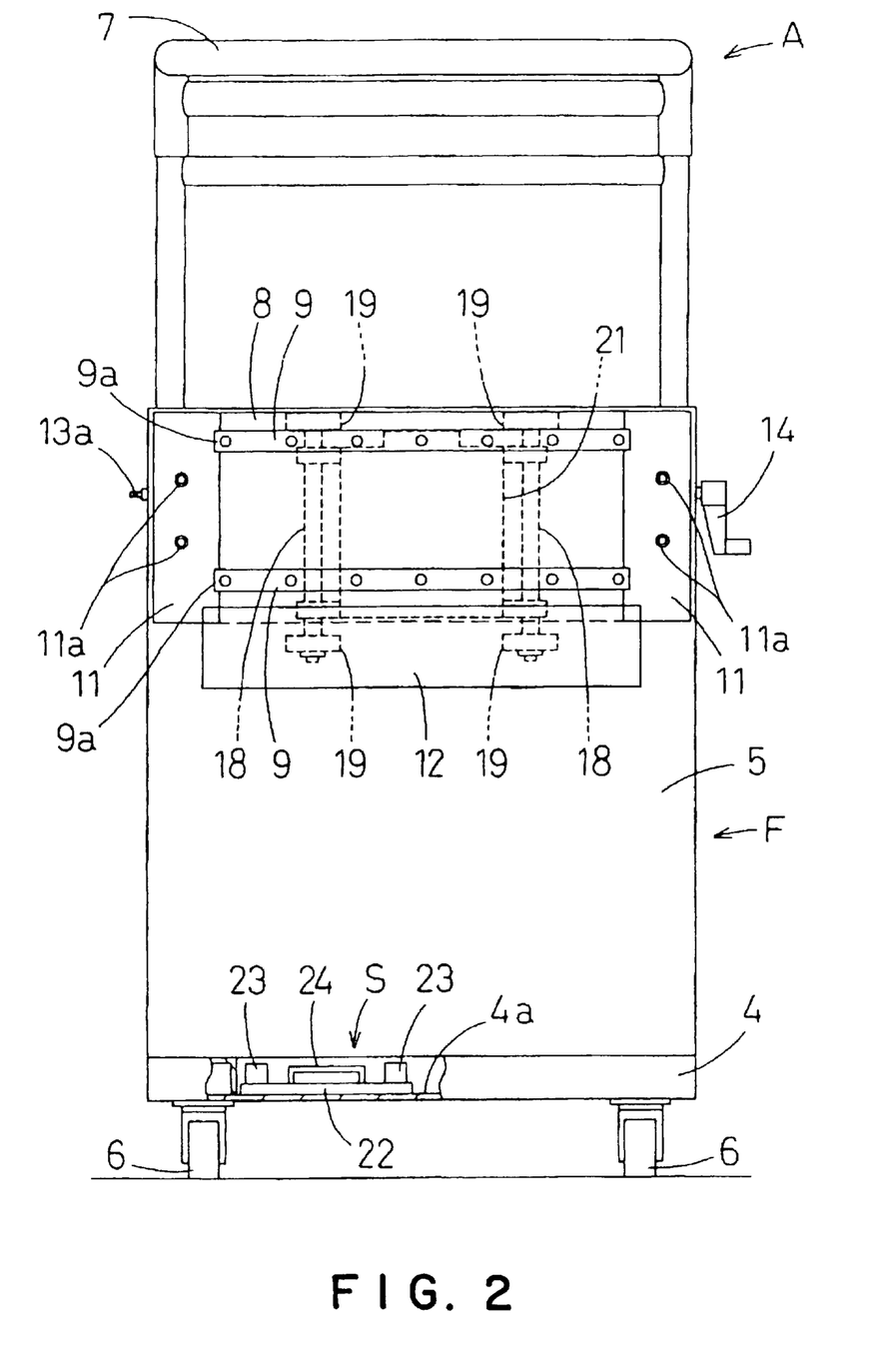
FIG. 2 is a front view of the mount/demount cart according to the embodiment of the present invention.
Figure 3:
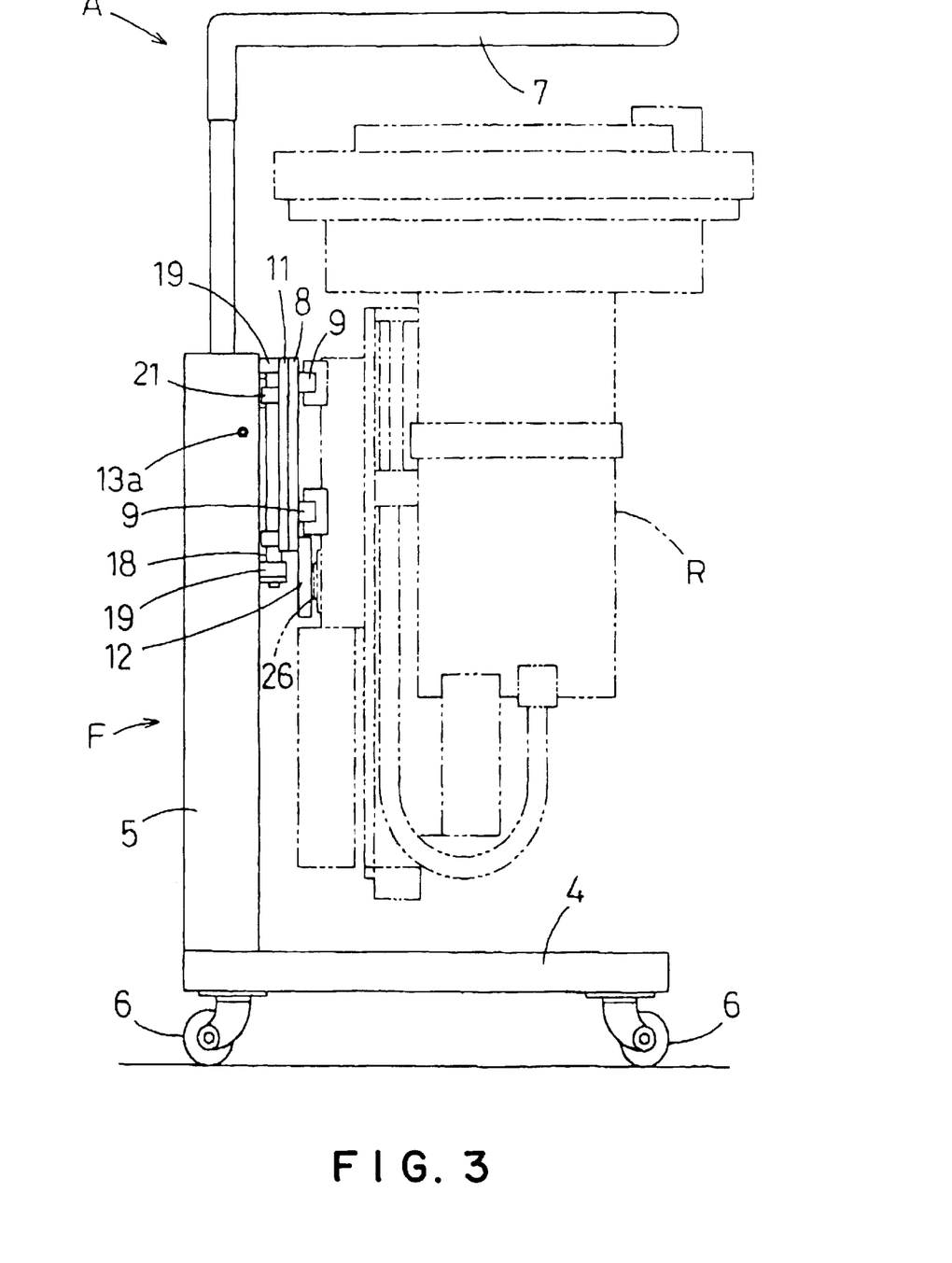
FIG. 3 is a side view of the mount/demount cart according to the embodiment of the present invention.
Figure 4:
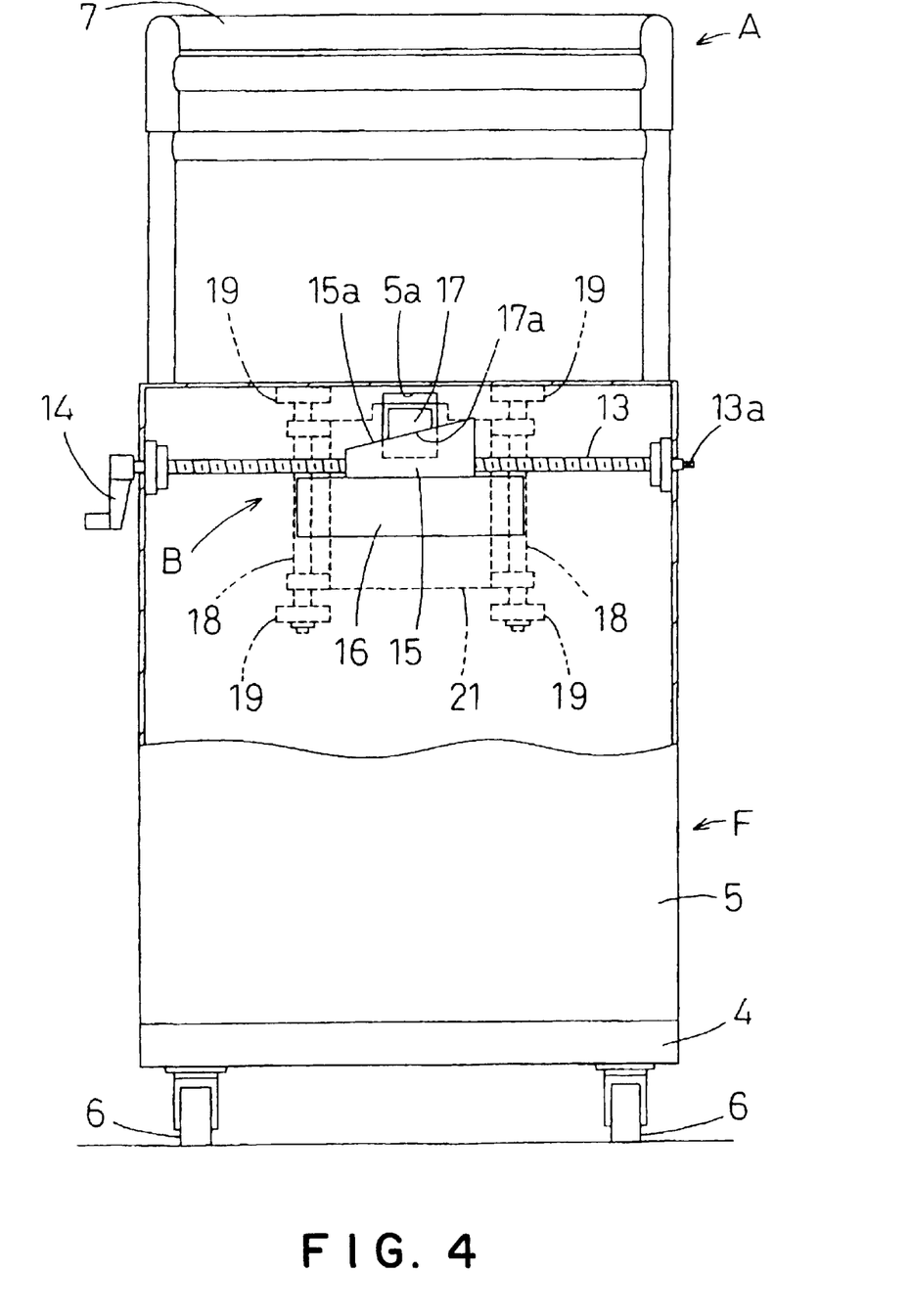
FIG. 4 is partially broken rear view of the mount/demount cart according to the embodiment of the present invention.
Figure 5:
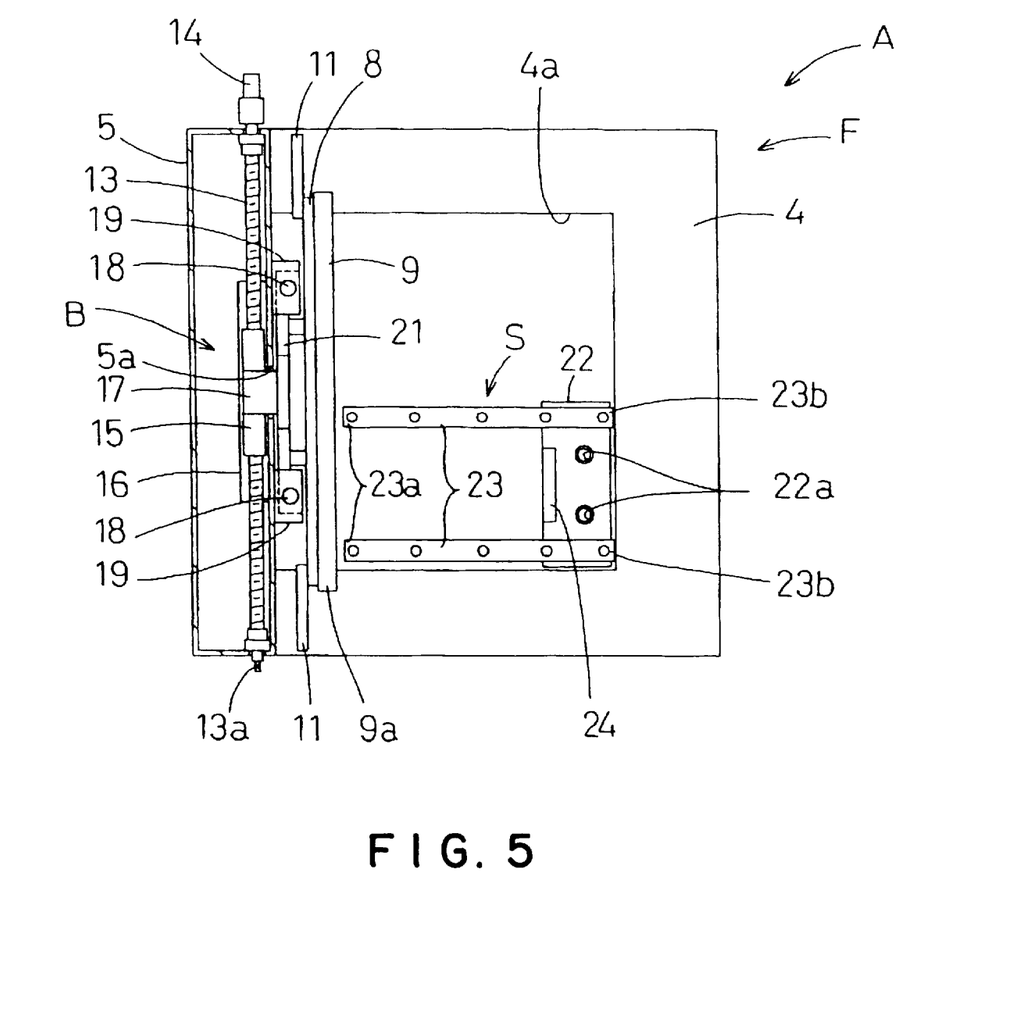
FIG. 5 is a plan view of the mount/demount cart according to the embodiment of the present invention.

The present invention will be explained in more detail by means of embodiments. FIG. 1 is a perspective view of a cart A for mounting/demounting a wafer transfer robot (hereinafter called a mount/demount cart) according to one embodiment of the present invention. FIG. 2 is a front view of the mount/demount cart A according to the embodiment. FIG. 3 is a side view of the mount/demount cart A according to the embodiment. FIG. 4 is a partially broken rear view of the mount/demount cart A according to the embodiment. FIG. 5 is a plan view of the mount/demount cart A according to the embodiment. As shown in FIGS. 1 to 5, An L-shaped cart frame F constituting the cart A according to the present embodiment includes a carrier base 4 and a raised portion 5 provided on the leading end of the carrier base 4. Casters 6 are attached respectively to the four corners of the underside of the carrier base 4, and an operation handle 7 is attached to the upper surface of the raised portion 5. A storing portion 4a for storing a joint rail S, which will be described later, is provided in the form of a cavity. The mount/demount cart A of the present embodiment has a width which permits the mount/demount cart A to run between the wafer transfer apparatus D and a wall W (see FIG. 7). The mount/demount cart A of the present embodiment has a height which is smaller than an orienter (wafer aligning means) 10 mounted on the wafer transfer apparatus D (see FIG. 8).

As shown in FIGS. 1 to 3, a mount/demount cart-side base plate 8 is mounted on the front side of the raised portion 5 capable of being moved up and down by lift means B (which will be described later). A pair of mount/demount cart-side rails 9 are horizontally mounted one above the other on the front side of the mount/demount cart-side base plate 8. A vertical interval between the pair of mount/demount cart-side rails 9 is the same as that between a pair of wafer transfer apparatus D-side rails 3 mounted on a wafer transfer apparatus D-side base plate 2. Application plates 11 for the joint rail S to be mounted on are secured respectively to both lateral ends of the back side of the mount/demount cart-side base plate 8, jutted beyond the both ends of the mount/demount cart-side base plate 8. Female screws 11a for securing the joint rail S are disposed on each application plate 11 at two positions. A brake plate 12 for actuating braking the wafer transfer robot R is mounted on the lower end of the mount/demount cart-side base plate 8.

Next, the lift means B will be explained. The lift means B slightly moves up and down the mount/demount cart-side base plate 8 so as to finely adjust a vertical height of the pair of mount/demount cart-side rails 9 mounted on the mount/demount cart-side base plate 8. As shown in FIGS. 4 and 5, a screw rod 13 is rotatably mounted horizontally (width-wise of the cart frame F) on the inside of the raised portion 5 of the cart frame F. Insert portions 13a is provided to be inserted in a lift handle 14 in a state that does not cause the lift handle 14 to be rotated idle. The respective insert portions 13a are jutted outward beyond the raised portion 5 of the cart frame F. A lift block 15 is screw-engaged with the screw rod 13 substantially at the middle of the axial direction. A guide block 16 is secured to the inside of the raised portion 5 of the cart frame F immediately below the lift block 15. The bottom surface of the lift block 15 is substantially in contact with the upper surface of the guide block 16. As the screw rod 13 is rotated by the lift handle 14, the lift block 15 is guided by the guide block 16 to be displaced horizontally. The lift block 15, which is displaced with the bottom surface thereof in contact with the upper surface of the guide block 16, is never rotated by the screw rod 13.

The upper surface of the lift block 16 is an inclined surface 15a. An interconnection block 17 having an inclined surface 17a conformed to the inclined surface 15a is provided in contact with the inclined surface 15a. The interconnection block 17 is a little jutted toward the front side of the raised portion 5 of the cart frame F through a window 5a formed in the front side of the raised portion 5. A couple of guide rods 18 are mounted vertically on an upper part of the front side of the raised portion 5, spaced from each other at a prescribed interval in the width-wise direction of the cart frame F. The respective guide rods 18 have the upper and the lower ends retained by rod support members 19 secured to the front side of the raised portion 5. As shown in FIG. 5, the interconnection block 17 is interconnected to a lift base 21 provided on the front side of the raised portion 5 of the cart frame F. The couple of guide rods 18 are inserted in both left and right ends of the lift base 21. The lift base 21 can be vertically moved along the couple guide rods 18. The mount/demount cart-side base plate 8 is secured to the front side of the lift base 21.

As shown in FIG. 4, the lift handle 14 is engaged with one of the inserts 13a of the screw rod 13 constituting the lift means B, and the lift handle is rotated in a prescribed direction. As the screw rod 13 is rotated, the lift block 15 is displaced horizontally. On the inclined surface 15a, which is the upper surface of the lift block 15, the interconnection block 17 is provided with the inclined surface 17a conformed to the inclined surface 15a in contact with the inclined surface 15a. As described above, the interconnection block 17 is guided by the couple of guide rods 18 and is secured to the lift base 21, which can be vertically displaced. Accordingly, as the lift block 15 is displaced horizontally, the lift base 21 is a little vertically displaced through the interconnection block 17. The mount/demount cart-side base plate 8 secured to the front side of the lift base 21 is vertically displaced together with the lift base 21. Consequently, a vertical position of the pair of mount/demount cart-side rails 9 mounted on the mount/demount cart-side base plate 8 can be finely adjusted. The lift means B can finely adjust a connection position between the wafer transfer apparatus-side guide rails 3 and the mount/demount car-side rails 9 so as to place both at the same height. Thus, the wafer transfer robot R can be moved smoothly onto the mount/demount cart-side rails 9.

Figure 7:
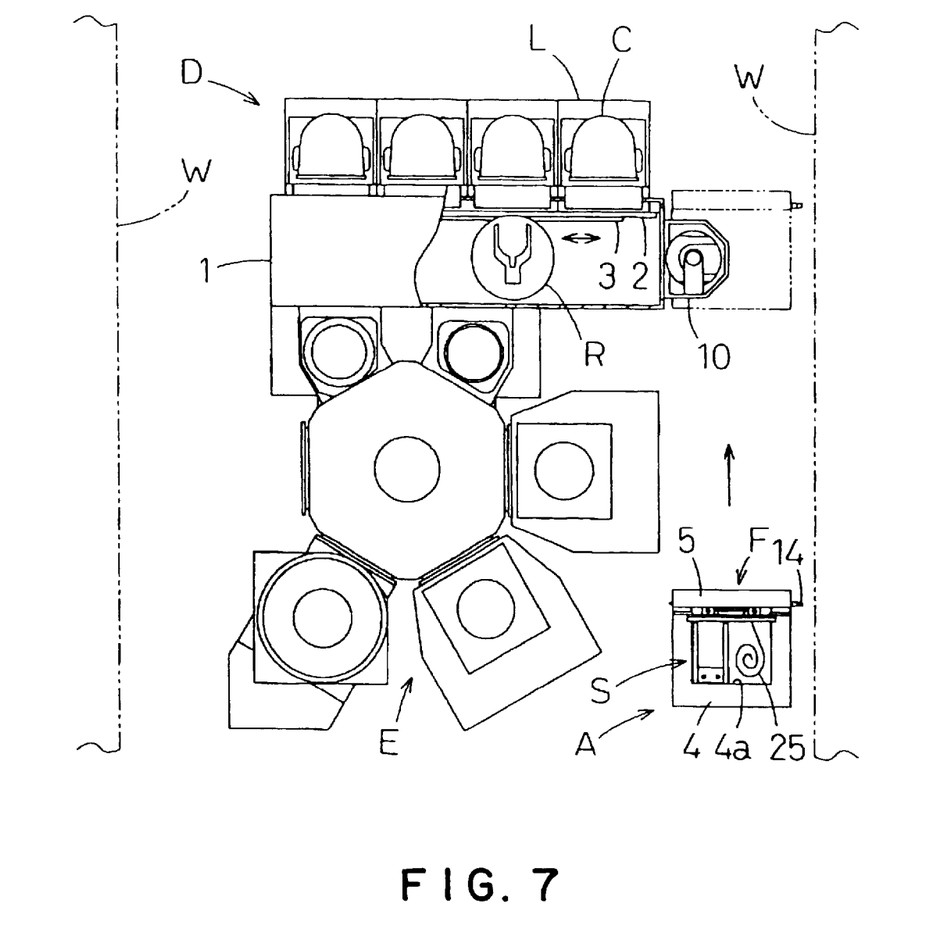
FIG. 7 is an explanatory view of the operation of positioning the mount/demount cart according to the embodiment of the present invention beside a side surface of a wafer transfer apparatus.
Figure 8:
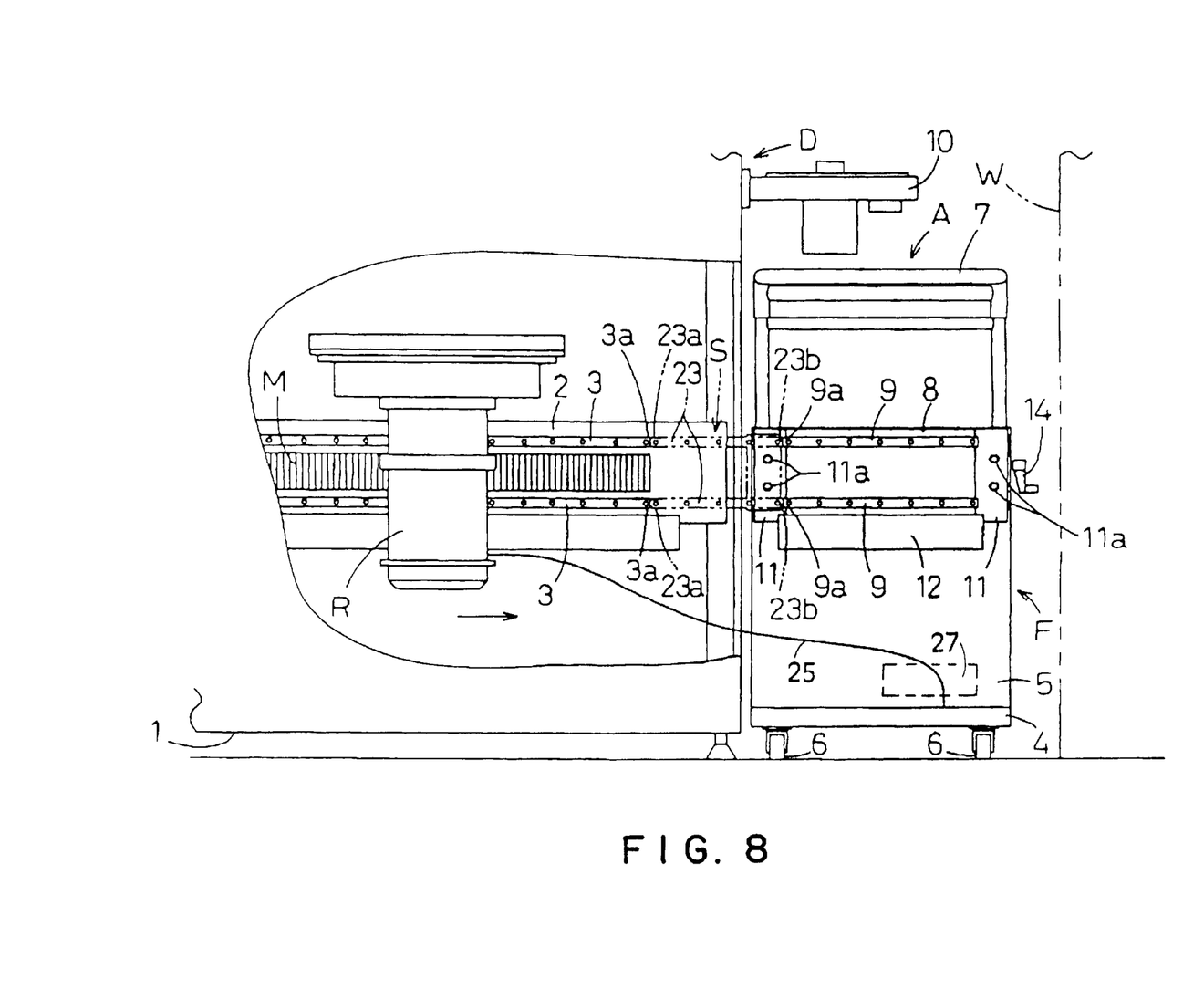
FIG. 8 is a front view of the mount/demount cart according to the present embodiment of the present invention positioned the side surface of the wafer transfer apparatus.

Then, with reference to FIG. 6, the joint rail S will be explained. As shown in FIGS. 7 and 8, the pair of wafer transfer apparatus-side guide rails 3 disposed inside the chamber of the wafer transfer apparatus D are not laid up to the end of the chamber 1. A gap is often formed between the pair of wafer transfer apparatus-side rails 3 and the pair of the mount/demount cart- side rails 9, and in such case, it is very difficult to slide the wafer transfer robot R in the wafer transfer apparatus D onto the pair of mount/demount cart-side rails 9. For filling a gap between the pair of wafer transfer apparatus-side guide rail 3 and the pair of mount/demount cart-side rails 9, long rails may be used as the mount/demount cart-side rails, but in this case, a problem is that the long mount/demount cart-side rails 9 will block run of the mount/demount cart A when the mount/demount cart A runs through a narrow passage. For the purpose of filling the gap between pair of wafer transfer apparatus-side guide rails 9 of the wafer transfer apparatus D and the pair of mount/demount cart-side rails 9 of the mount/demount cart A, the joint rail S is provided between the two.

Figure 6:
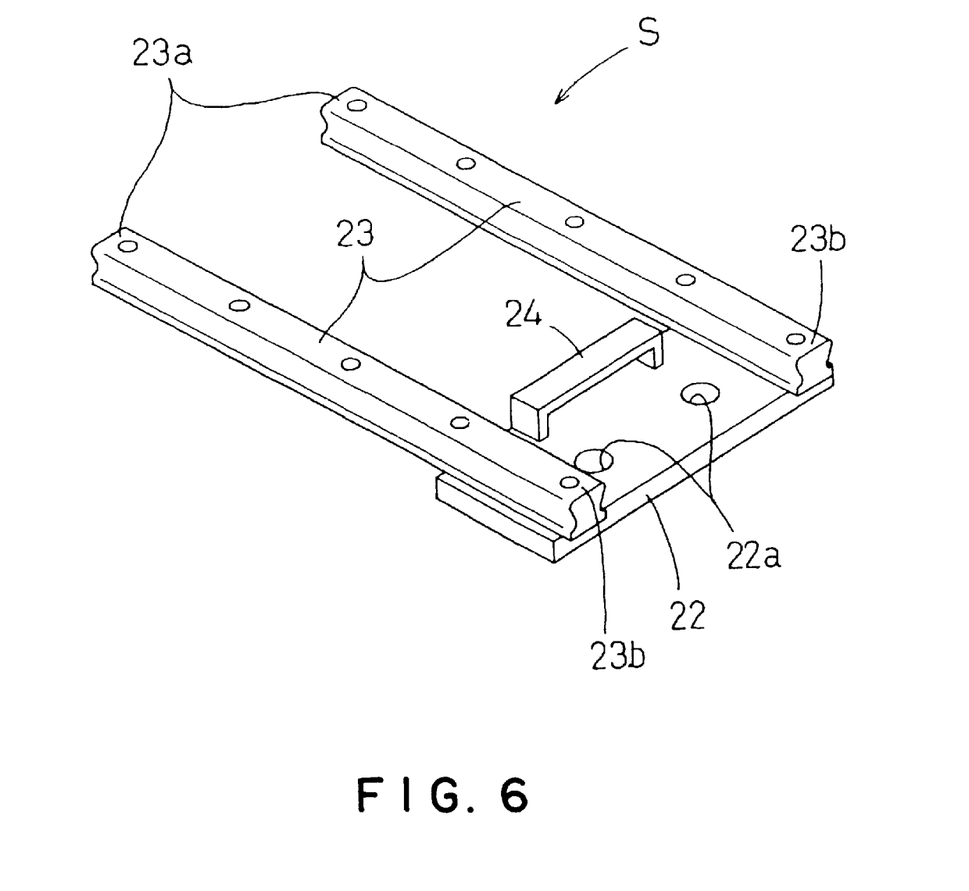
FIG. 6 is a perspective view of the joint rail according to the embodiment of the present invention.

As shown in FIGS. 1, 5 and 6, the joint rails of the present embodiment includes a pair of sub-rails 23 mounted on the front side of a sub-base plate 22. An interval between the pair of sub-rails 23 is the same as that between the pair of wafer transfer apparatus-side guide rails 3 of the wafer transfer apparatus D. The pair of sub-rails 23 have large parts jutted beyond one end of the sub-base plate 22. The sub-base plate 22 has screw holes 22a formed in, and the screw holes 22a correspond to the female screws provided on the application plates 11 of the mount/demount cart A. In FIG. 6, reference number 24 indicates a grip for holding the joint rail S.

The joint rail S is to be mounted on either of the application plates 11 of the mount/demount cart A in the following way. When the mount/demount cart A is positioned near the side surface of a side of the wafer transfer apparatus D, as shown in FIGS. 7 and 8, the joint rail S is mounted on the application plate 11 on the side nearer the wafer transfer apparatus D. That is, the respective screw holes 22a of the sub-base plate 22, and the female screws 11a of the application plate 11 are registered with connect ends 9a of the pair of mount/demount cart-side rails 9 and the other connection ends 23 of the pair of sub-rails 23 substantially linearly connected with each other, and both are set by securing means such as set bolts (not shown). Then, a vertical position of the wafer transfer apparatus-side base plate 8 is finely adjusted by the lift means B, and the connection ends 23a of one side (the side largely jutted beyond the sub-base plate 22) of the pair of sub-rails 23 are positioned at substantially the same height as the connection ends 3a of the pair of wafer transfer apparatus-side guide rails 3. Thus, the pair of wafer transfer apparatus-side guide rails 3 of the wafer transfer apparatus D and the pair of mount/demount cart-side rails 9 of the mount/demount cart A are substantially linearly connected with each other through the joint rail S. The joint rail S is normally stored in the storing portion 4a in the carrier base 4 of the cart frame F, so that even when the mount/demount cart A moves along a narrow passage, the joint rail S does not become a barrier to the pass.

When a gap is formed between the wafer transfer apparatus D and the mount/demount cart A, the joint rail S of the present invention for filling the gap is mounted on the base plates constituting the mount/demount cart A, and the wafer transfer robot R is moved onto the pair of mount/demount cart-side rails 9 of the mount/demount cart A via the joint rail S. The joint rail S is removable from the base plates, so that even when a passage along which the mount/demount cart A runs is narrow, the mount/demount cart A does not block the run.

The operation of the mount/demount cart A according to the present invention will be explained. As shown in FIG. 7, the mount/demount cart A is run along a wall W between the chamber 1 of the wafer transfer apparatus D and the wall W to be positioned near one of the sides of the chamber 1. The joint rail S is stored in the storing portion 4a in the carrier base 4 of the carrier frame F during the run of the mount/demount cart A, and causes no trouble during the run of the mount/demount cart A. As shown in FIG. 8, a height of the mount/demount cart A is smaller than the orienter 10, and does not interfere with the orienter 10.

When the mount/demount cart A is positioned near the side surface of one side of the chamber 1 of the wafer transfer apparatus D, the respective casters 6 are locked to be paused. As shown in FIG. 8, the joint rail S is mounted on that of the application plates of the mount/demount cart A, which is nearer the chamber 1, with the connection ends 9a of the pair of mount/demount cart-side rails 9 being substantially linear with the other connection ends 23b of the pair of sub-rails 23 on the other side. Subsequently, the connection ends 23a of the sub-rails 23 on one side (largely jutted beyond the sub-base plate 22) are connected to the connection ends 3a of the pair of wafer transfer apparatus-side guide rails 3. At this time, when the pair of wafer transfer apparatus-side guide rails 3 and the pair of sub-rails 23 are not in line with each other, the lift handle 14 is rotated in a required direction to vertically move the mount/demount cart-side base plate 8 to bring both into alignment with each other in height. Those of the pair of sub-rails 23 which are jutted beyond the sub-base plate 22 are secured to the wafer transfer apparatus-side base plate 2 by securing means, set bolts (not shown). Thus, the joint rail S is supported by both of the wafer transfer apparatus-side base plate and the mount/demount cart-side base plate 8, so that the wafer transfer robot R, which is heavy, can be properly moved.

Figure 9:
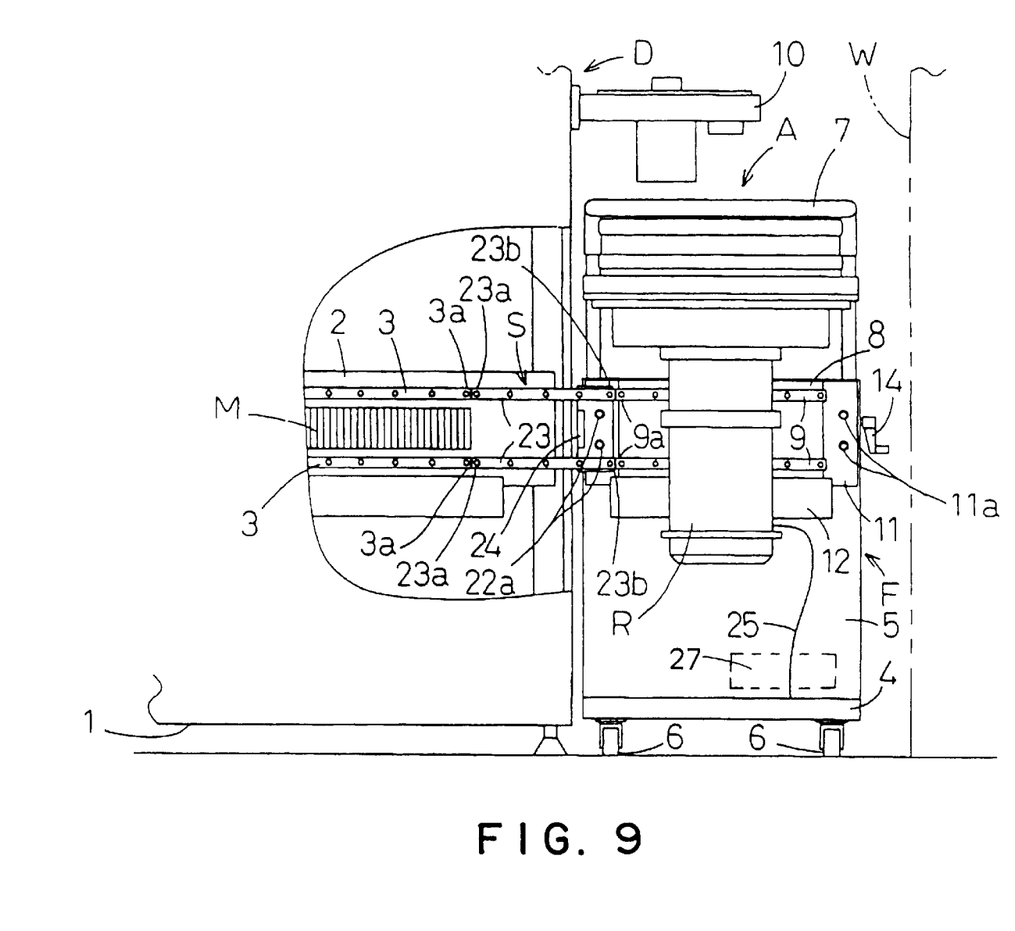
FIG. 9 is an explanatory view of the operation of sliding the wafer transfer robot via the joint rail onto the pair of mount/demount cart-side rails of the mount/demount cart frame.
Figure 10:
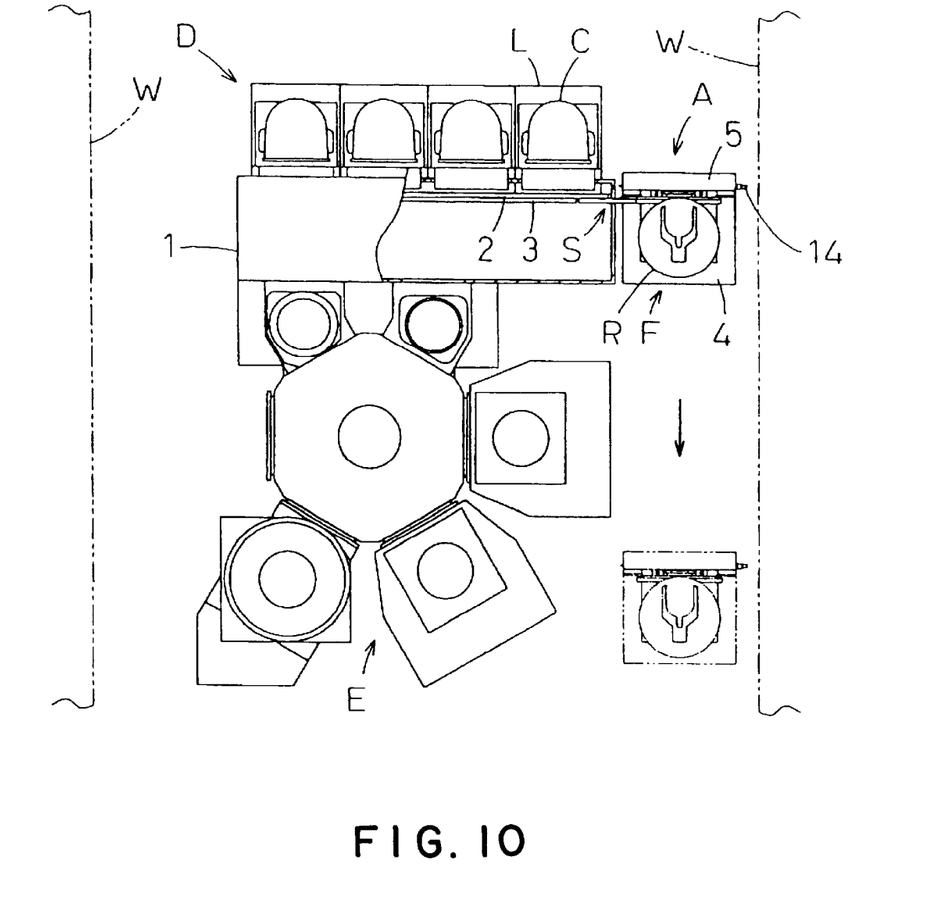

A 24 V-electric power source 27 is provided in the mount/demount cart A of the present embodiment. A power cable 25 connected to the power source 27 is drawn out to supply electric power to the wafer transfer robot R. As shown in FIG. 7, the power cable 25 is normally stored in the storing portion 4a in the carrier base 4 of the cart frame F. As shown in FIG. 8, when the power cable 25 has been connected to the wafer transfer robot R, the brake 26 of the wafer transfer robot R is released (see FIG. 3), and the wafer transfer robot R can be manually moved. The electric power source 27 is stopped when, as shown in FIG. 9, the wafer transfer robot R has been moved from the pair of wafer transfer apparatus-side guide rails 3 onto the pair of mount/demount cart-side rails 9 via the pair of sub-rails 23. The wafer transfer robot R is retained upright on the pair of mount/demount cart-side rails 9. Upon the stop of the electric power source 27, with the wafer transfer robot R set in this state, the brake 26 of the wafer transfer robot R is actuated to press the brake plate 12 (FIG. 3), and the wafer transfer robot R is retained stable on the pair of mount/demount cart-side rails 9 of the mount/demount cart A. Subsequently, the joint rail S is removed and stored in the storing portion 4a in the carrier base 4 of thee cart frame F. Then, as shown in FIG. 10, the mount/demount cart A holding the wafer transfer robot R is retreated. When the wafer transfer robot R is to be mounted on the pair of wafer transfer apparatus-side guide rails 3, the above-described procedure is oppositely followed.

Until sub-electric source power (24V) is applied, the brake of the wafer transfer robot R in the wafer transfer apparatus D is on. When the wafer transfer robot R is to be slid, the brake 26 of the wafer transfer robot R can be released at the position by applying the sub-electric source power, which makes the operation efficient. When the wafer transfer robot R is mounted on the mount/demount cart-side rails 9, the brake of the wafer transfer robot R is actuated so as to be more stably retained without a risk that the wafer transfer robot R is slid to fall off in the run of the mount/demount cart A.

In the present embodiment, the joint rail S is removably connected so as to fill a gap between the wafer transfer apparatus D and the mount/demount cart A. However, the joint rail S may not be used. For example, the mount/demount cart-side base plate 8 with the pair of mount/demount cart-side rails 9 mounted slides toward the wafer transfer apparatus D to connect the pair of wafer transfer apparatus-side guide rails 3 directly to the pair of mount/demount cart-side rails 9.

In the present embodiment, the wafer transfer apparatus-side guide rail 3, the mount/demount cart-side rail 9 and the sub-rail 23 are each formed in the form of a pair of rails mounted substantially horizontally one above the other. In this case, the wafer transfer robot R always has the upper and the lower parts supported by the respective rails 3, 9, 23, which has an advantage that the wafer transfer robot R is slid stably. However, the respective rails may be single.

In the present embodiment, the wafer transfer robot which is driven by the linear motor M is slid, which has advantages that the constitution of the wafer transfer apparatus-side guide rails 3 can be simple, and the wafer transfer robot R can be merely slid to be mounted and demounted as it is. Accordingly, the operation is simple. However, a motor, e.g., a rack and pinion, other than the linear motor may be used to slide the wafer transfer robot R.

The mount/demount cart for mounting and demounting the wafer transfer robot according to the present invention is a cart for mounting and demounting the wafer transfer robot mounted on the guide rails mounted on the inside wall of the wafer transfer apparatus, and includes the raised portion and the rails which can be connected to the guide rails for retaining the wafer transfer robot. Operators may merely slide the wafer transfer robot, which is heavy, along the guide rails, and the operation is simple. When the wafer transfer robot has been moved onto the mount/demount cart-side rails, the wafer transfer robot is supported upright and accordingly stable.

What is claimed is:

1. A wafer transfer robot mount/demount cart for mounting/demounting and carrying a wafer transfer robot outside a wafer transfer apparatus by linearly reciprocating along a horizontally mounted guide rail, comprising:

a carrier base;

a raised portion raised on the carrier base, the raised portion including a rail provided connectible to the guide rail to slide the wafer transfer robot along the guide rail of the wafer transfer apparatus onto the wafer transfer robot mount/demount cart; and a sub-electric power source, whereby a brake of the wafer transfer robot while on the guide rail is released by supplying electric power from the sub-electric power source so that the wafer transfer robot can be moved from the guide rail of the wafer transfer apparatus onto the rail of the wafer transfer robot mount/demount cart, and the brake of the wafer transfer robot is actuated by discontinuing the electric power supply from the sub-electric power source after the wafer transfer robot is retained on the rail of the wafer transfer robot mount/demount cart.

2. The wafer transfer robot mount/demount cart according to claim 1, wherein the carrier base has casters on the underside thereof.

3. The wafer transfer robot mount/demount cart according to claim 1, further comprising lift means for vertically moving the rail.

4. The wafer transfer robot mount/demount cart according to claim 3, wherein the lift means comprises a screw rod rotatably disposed inside the raised portion, a lift block screw-engaged with the screw rod, and an interconnection block engaged with the lift block to transform and transmit a motion of the lift block made by rotation of the screw rod to a vertical motion of the rail of the wafer transfer robot mount/demount cart.

5. The wafer transfer robot mount/demount cart according to claim 4, wherein the lift means comprises a lift handle removably mounted on one end of the screw rod.

6. The wafer transfer robot mount/demount cart according to claim 1, further comprising a joint rail which can be mounted on and removed from the raised portion, and which fills a gap between the guide rail of the wafer transfer apparatus and the rail of the wafer transfer robot mount/demount cart.

7. The wafer transfer robot mount/demount cart according to claim 6, further comprising lift means for vertically moving the joint rail and the rail of the wafer transfer robot mount/demount cart together.

8. The wafer transfer robot mount/demount cart according to claim 6, wherein the joint rail comprises securing means provided on an end jutted toward the guide rail of the wafer transfer apparatus when the joint rail is mounted on the raised portion, for securing said end to a corresponding end of the guide rail in alignment with each other.

9. The wafer transfer robot mount/demount cart according to claim 6, wherein the carrier base comprises a cavity for storing the joint rail.

10. The wafer transfer robot mount/demount cart according to claim 1, further comprising a brake plate for braking the wafer transfer robot.

11. The wafer transfer robot mount/demount cart according to claim 1, wherein the guide rail of the wafer transfer apparatus and the rail of the raised portion are each in the form of a pair of rails mounted horizontally one above another.

12. The wafer transfer robot mount/demount cart according to claim 1, wherein the rail of the raised portion is capable of being connected to the guide rail for the wafer transfer robot driven by a linear motor.

* * * * *